(12) United States Patent
Zhu et al.

(10) Patent No.: US 12,314,477 B2
(45) Date of Patent: *May 27, 2025

(54) WEARABLE DEVICE ENABLING MULTI-FINGER GESTURES

(71) Applicant: Microsoft Technology Licensing, LLC, Redmond, WA (US)

(72) Inventors: Haichao Zhu, Beijing (CN); Masaaki Fukumoto, Beijing (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/459,279

(22) Filed: Aug. 31, 2023

(65) Prior Publication Data

US 2023/0409124 A1   Dec. 21, 2023

Related U.S. Application Data

(63) Continuation of application No. 17/588,199, filed on Jan. 28, 2022, now Pat. No. 11,782,515, which is a
(Continued)

(51) Int. Cl.
*G06F 3/01* (2006.01)
*G04G 21/02* (2010.01)
(Continued)

(52) U.S. Cl.
CPC .............. *G06F 3/017* (2013.01); *G06F 1/163* (2013.01); *G06F 3/014* (2013.01); *G06T 17/00* (2013.01); *G04G 21/02* (2013.01)

(58) Field of Classification Search
CPC ...................................................... G06F 3/017
See application file for complete search history.

(56) References Cited

U.S. PATENT DOCUMENTS 9,582,076 B2   2/2017   Kienzle
9,594,427 B2   3/2017   Priyantha et al.
(Continued)

FOREIGN PATENT DOCUMENTS

WO   2016137514 A1   9/2016
WO   2016168097 A1   10/2016

OTHER PUBLICATIONS

Office Action Received for European Application No. 22202055.4, mailed on Nov. 14, 2023, 8 pages.
(Continued)

*Primary Examiner* — Shivang I Patel
(74) *Attorney, Agent, or Firm* — Barta Jones, PLLC

(57) ABSTRACT

Embodiments of the subject matter described herein provide a wearable device enabling multi-finger gestures. The wearable device generally includes a first sensor, a second sensor and a controller. The first sensor can detect a first set of one or more movements of a first finger of a user. The second sensor can detect a second set of one or more movements of a second finger that is different from the first finger. The controller is configured to detect a multi-finger gesture by determining a relative movement between the first finger and the second finger based on the first and second sets of movements and to control a terminal device in association with the wearable devices based on the multi-finger gesture.

20 Claims, 10 Drawing Sheets

Related U.S. Application Data continuation of application No. 16/619,923, filed as application No. PCT/CN2017/087814 on Jun. 9, 2017, now Pat. No. 11,237,640.

(51) Int. Cl.
   *G06F 1/16*   (2006.01)
   *G06T 17/00*  (2006.01)

(56) References Cited

U.S. PATENT DOCUMENTS

| | | | |
|---|---|---|---|
| 2014/0176809 A1 | 6/2014 | Chen | |
| 2015/0062086 A1 | 3/2015 | Nattukallingal | |
| 2016/0077587 A1* | 3/2016 | Kienzle | G06F 3/033 345/156 |
| 2017/0351345 A1* | 12/2017 | Nirjon | G06F 3/014 |

OTHER PUBLICATIONS

Communication under Rule 71(3) Received for European Application No. 22202055.4, mailed on Mar. 26, 2024, 8 pages.

"D-pad", Retrieved From: https://en.wikipedia.org/w/index_php?title=D-pad&oldid=769343347, Retrieved Date: Apr. 25, 2017, 4 Pages.

"DualShock", Retrieved From URL: https://en.wikipedia.org/w/index_php?title=DualShock&oldid=769254150, Retrieved Date: Apr. 25, 2017, 7 Pages.

"File:DualShock 4.jpg", Retrieved From: https://commons.wikimedia_org/w/index.php?curid=29652833, Retrieved Date Apr. 25, 2017, 7 Pages.

"File:Nintendo-Famicom-Controller-I-FL.jpg", Retrieved From: https://commons.wikimedia_org/w/index.php? curid=16651424, Retrieved Date: Apr. 25, 2017, 3 Pages.

"Fujitsu Laboratories Develops Ring-Type Wearable Device Capable of Text Input by Fingertip", Retrieved From URL: https://web.archive.org/web/20150122113600/https://www.fujitsu.com/global/about/resources/news/pressreleases/2015/0113-01.html, Jan. 22, 2015, 4 Pages.

"Google Glass", Retrieved From: https://en_wikipedia.org/w/index_php?title=Google_Glass&oldid=769091174, Retrieved Date: Apr. 25, 2017, 10 Pages.

"Minimalism (computing)", Retrieved From: https://en.wikipedia_org/w/index_php?title=Minimalism_(computing)3Loldid=769548321, Mar. 10, 2017, 4 Pages.

"Proximity and Ambient Light Sensing (ALS) Module", Retrieved From URL: https://www_st.com/resource/en/datasheet/vl6180x.pdf, Mar. 2016, 87 Pages.

"Ring by Logbar—Shortcut Everything-", Retrieved From: https://www.kickstarter_com/projects/1761670738/ringshortcut-everything, Retrieved Date Apr. 24, 2017, 10 Pages.

"Ring Zero", Retrieved From URL: https://web.archive.org/web/20170309191236/http://ringzero.logbarti, Retrieved on: Mar. 9, 2017, 6 Pages.

Ashbrook, et al., "Bitey: An Exploration of Tooth Click Gestures for Hands-Free User Interface Control", In Proceedings of the 18th International Conference on Human-Computer Interaction with Mobile Devices and Services, Sep. 6, 2016, 12 Pages.

Ashbrook, et al., "Nenya: Subtle and Eyes-Free Mobile Input with a Magnetically-Tracked Finger Ring", In Proceedings of the SIGCHI Conference on Human Factors in Computing Systems, May 7, 2011, pp. 2043-2046.

Chan, et al., "CyclopsRing: Enabling Whole-Hand and Context-Aware Interactions Through a Fisheye Ring", In Proceedings of the 28th Annual ACM Symposium on User Interface Software & Technology, Nov. 8, 2015, 8 pages.

Chan, et al., "FingerPad: Private and Subtle Interaction Using Fingertips", In Proceedings of the 26th Annual ACM Symposium on User Interface Software and Technology, Oct. 8, 2013, pp. 255-260.

Deyle, et al., "Hambone: A Bio-Acoustic Gesture Interface", In Proceedings of 11th IEEE International Symposium on Wearable Computers, Oct. 11, 2007, 8 Pages.

Etherington, Darrell, "The Ring Input Device Puts Gesture Control And Home Automation On Your Finger", Retrieved From URL: https://techcrunch.com/2014/02/28/the-ring-input-device-puts-gesture-control-and-home-automationm-your-finged, Feb. 28, 2014, 8 Pages.

Fukahori, et al., "Exploring Subtle Foot Plantar-based Gestures with Sock-placed Pressure Sensors", In Proceedings of the 33rd Annual ACM Conference on Human Factors in Computing Systems, Apr. 18, 2015, 10 Pages.

Fukui, et al., "Hand Shape Classification with a Wrist Contour Sensor: Development of a Prototype Device", In Proceedings of the 13th International Conference on Ubiquitous Computing, Sep. 17, 2011, 4 Pages.

Fukumoto, Masaaki, "A Finger-Ring Shaped Wearable Handset Based on Bone-Conduction", In Proceedings of ninth IEEE International Symposium on Wearable Computers, Oct. 18, 2005, 4 Pages.

Harrison, et al., "Skinput: Appropriating the Body as an Input Surface", In Proceedings of the SIGCHI Conference on Human Factors in Computing Systems, Apr. 10, 2010, 10 Pages.

Huang et al., "DigitSpace: Designing Thumb-to-Fingers Touch Interfaces for One-Handed and Eyes-Free interactions", In Proceedings of the CHI Conference on Human Factors in Computing Systems, May 7, 2016, pp. 1526-1537.

Huang, et al., "Leveraging Dual-Observable Input for Fine-Grained Thumb Interaction Using Forearm EMG", In Proceedings of the 28th Annual ACM Symposium on User Interface Software & Technology, Nov. 8, 2015, pp. 523-528.

Iwamoto, et al., "Finger Ring Tactile Interface Based on Propagating Elastic Waves on Human Fingers", In Proceedings of the Second Joint EuroHaptics Conference and Symposium on Haptic Interfaces for Virtual Environment and Teleoperator Systems, Mar. 22, 2007, 6 Pages.

Jung, et al., "A Wearable Gesture Recognition Device for Detecting Muscular Activities Based on Air-Pressure Sensors", In Journal of IEEE Transactions on Industrial Informatics, vol. 11, Issue 2, Apr. 2015, pp. 485-494.

Kao, et al., "Duoskin: Rapidly Prototyping On-Skin User Interfaces Using Skin-Friendly Materials", In Proceedings of ACM International Symposium on Wearable Computers, Sep. 12, 2016, 8 Pages.

Kao, et al., "NailO: Fingernails as an Input Surface", In Proceedings of the 33rd Annual ACM Conference on Human Factors in Computing Systems, Apr. 18, 2015, 5 Pages.

Ketabdar, et al., "Pingu: A New Miniature Wearable Device for Ubiquitous Computing Environments", In Proceedings of Sixth International Conference on Complex, Intelligent and Software Intensive Systems, Jul. 4, 2012, 5 Pages.

Kienzle, et al., "LightRing: Always-Available 2D Input on Any Surface", In Proceedings of the 27th Annual ACM Symposium on User Interface Software and Technology, Oct. 5, 2014, 4 Pages.

Kim, et al., "Digits: Freehand 3D Interactions Anywhere Using a Wrist-Worn Gloveless Sensor", In Proceedings of the 25th Annual ACM Symposium on User Interface Software and Technology, Oct. 7, 2012, pp. 167-176.

Laput, et al., "Skin Buttons: Cheap, Small, Low-Powered and Clickable Fixed-Icon Laser Projectors", In Proceedings of the 27th annual ACM Symposium on User Interface Software and Technology, Oct. 5, 2014, pp. 389-394.

Lien, et al., "Soli: Ubiquitous Gesture Sensing with Millimeter Wave Radar", In Journal of ACM Transactions on Graphics, vol. 35, Issue 4, Jul. 2016, 19 Pages.

Manabe, et al., "Tap Control for Headphones Without Sensors", In Proceedings of the 24th Annual ACM Symposium on User Interface Software and Technology, Oct. 16, 2011, pp. 309-313.

Masaaki, "FingeRing: A Full-Time Wearable Interface", In Proceedings of Conference Companion on Human Factors in Computing Systems, Apr. 24, 1994, pp. 81-82.

McCracken, Harry, "Put a (Smart) Ring on It: Nod Introduces an Input Device for Your Finger", Retrieved From URL: https://time_com/80534/put-a-smart-ring-on-it-nod-introduces-an-input-device-for-your-finger/, Apr. 29, 2014, 11 Pages.

(56) References Cited

OTHER PUBLICATIONS

Mujibiya, et al., "The Sound of Touch: On-body Touch and Gesture Sensing Based on Transdermal Ultrasound Propagation", In Proceedings of the ACM international conference on Interactive tabletops and surfaces, Oct. 6, 2013, pp. 189-198.
Nanayakkara, et al., "EyeRing: A Finger-Worn Input Device for Seamless Interactions with our Surroundings", In Proceedings of 4th Augmented Human International Conference, Mar. 7, 2013, pp. 13-20.
Nirjon, et al., "TypingRing: A Wearable Ring Platform for Text Input", In Proceedings of the 13th Annual International Conference on Mobile Systems, Applications, and Services, May 18, 2015, 14 Pages.
Ogata, et al., "SkinWatch: Skin Gesture Interaction for Smart Watch", In Proceedings of the 6th Augmented Human International Conference, Mar. 9, 2015, pp. 21-24.
Rekimoto, Jun, "GestureWrist And GesturePad: Unobtrusive Wearable Interaction Devices", In Proceedings of 5th IEEE International Symposium on Wearable Computers, Oct. 8, 2001, 7 Pages.
Rohildev, N, "Fin: Wearable Ring", Retrieved From URL: https://www.indiegogo.com/projects/fin-wearable-ring#/, Nov. 17, 2015, 9 Pages.
Saponas, et al., "Enabling Always-Available Input With Muscle-Computer Interfaces", In Proceedings of the 22nd annual ACM symposium on User interface software and technology, Oct. 4, 2009, 10 Pages.
Tsai, et al., "ThumbRing: Private Interactions Using One-handed Thumb Motion Input on Finger Segments", In Proceedings of the 18th International Conference on Human-Computer Interaction with Mobile Devices and Services Adjunct, Sep. 6, 2016, 8 Pages.
Wang, et al., "Interacting with Soli: Exploring Fine-Grained Dynamic Gesture Recognition in the Radio-Frequency Spectrum", In Proceedings of the 29th Annual Symposium on User Interface Software and Technology, Oct. 16, 2016, 10 Pages.
Weigel, et al., "iSkin: Flexible, Stretchable and Visually Customizable On-Body Touch Sensors for Mobile computing", In Proceedings of the 33rd Annual ACM Conference on Human Factors in Computing Systems, Apr. 18, 2015, pp. 2991-3000.
Wen, et al., "Serendipity: Finger Gesture Recognition using an Off-the-Shelf Smartwatch", In Proceedings of the CHI conference on Human Factors in Computing Systems, May 7, 2016. 6 Pages.
Wilhelm, et al., "eRing: Multiple Finger Gesture Recognition with One Ring using an Electric Field", In Proceedings of the 2nd International Workshop on Sensor-based Activity Recognition and Interaction, Jun. 25, 2015, 6 Pages.
Zhang, et al., " Tomo: Wearable, Low-Cost Electrical Impedance Tomography for Hand Gesture Recognition", In Proceedings of the 28th Annual ACM Symposium on User Interface Software & Technology, Nov. 8, 2015, 7 Pages.
Zhang, et al., "A Ring-shaped Interactive Device for Large Remote Display and Mobile Device Control", In Proceedings of the 13th International Conference on Ubiquitous Computing, Sep. 17, 2011, pp. 473-474.
Zhang, et al., "SkinTrack: Using the Body as an Electrical Waveguide for Continuous Finger Tracking on the Skin", In Proceedings of the CHI Conference on Human Factors in Computing Systems, May 7, 2016, 13 Pages.
Zhou, et al., "AuraSense: Enabling Expressive Around-Smartwatch Interactions with Electric Field Sensing", In Proceedings of the 29th Annual Symposium on User Interface Software and Technology, Oct. 16, 2016, 6 Pages.
Amento, et al., "The Sound of One Hand: A Wrist-Mounted Bio-Acoustic Fingertip Gesture Interface", In Proceedings of Extended Abstracts on Human Factors in Computing Systems, Apr. 20, 2002, pp. 724-725.
Dementyev, et al., "WristFlex: Low-Power Gesture Input with Wrist-Worn Pressure Sensors", In Proceedings of the 27th annual ACM symposium on User Interface Software and Technology, Oct. 5, 2014, 6 Pages.
Fukumoto, et al., "Whisper: A Wristwatch Style Wearable Handset", In Proceedings of the SIGCHI conference on Human Factors in Computing Systems, May 15, 1999, pp. 112-119.
Gong, et al., "WristWhirl: One-handed Continuous Smartwatch Input using Wrist Gestures", In Proceedings of the 29th Annual Symposium on User Interface Software and Technology, Oct. 16, 2016, pp. 861-872.
Laput, et al., "ViBand: High-Fidelity Bio-Acoustic Sensing Using Commodity Smartwatch Accelerometers", In Proceedings of the 29th Annual Symposium on User Interface Software and Technology, Oct. 16, 2016, pp. 321-333.
Tsai, et al., "TouchRing: Subtle and Always-Available Input using a Multi-Touch Ring", In Proceedings of the 18th international Conference on Human-Computer Interaction with Mobile Devices and Services Adjunct, Sep. 6, 2016, 8 Pages.
Yoon, et al., "Wearable Textile Input Device with Multimodal Sensing for Eyes-free Mobile Interaction During Daily Activities", In Journal of Pervasive and Mobile Computing, vol. 33, Dec. 2016, 18 Pages.
CPA Global; Patentability Search Report; Apr. 17, 2017; 19 pages.
Communication pursuant to Rules 70(2) and 70a (2) EPC received for European Application No. 22202055.4, mailed on Mar. 14, 2023, 2 pages.
Communication pursuant to Rules 70(2) and 70a(2) EPC Issued in European Patent Application No. 17913035.6 mailed on Apr. 13, 2021, 1 page.
Decision to Grant received for European Application No. 22202055.4, mailed on Aug. 1, 2024, 2 pages.

\* cited by examiner

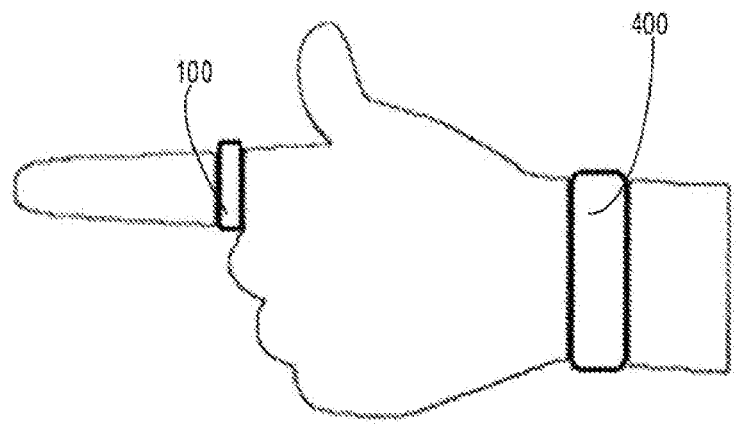
FIG. 3
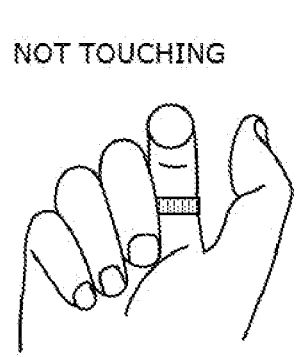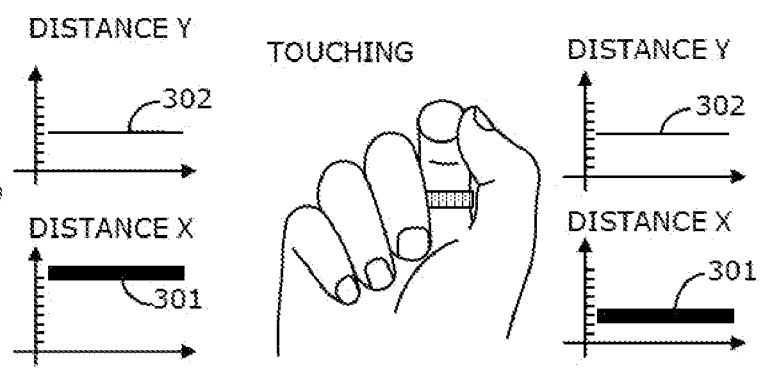
FIG. 4a          FIG. 4b

WEARABLE DEVICE ENABLING MULTI-FINGER GESTURES

CROSS-REFERENCE TO RELATED APPLICATION

This application is a continuation application of and claims priority to U.S. patent application Ser. No. 17/588,199, entitled "WEARABLE DEVICE ENABLING MULTI-FINGER GESTURES," filed on Jan. 28, 2022, which is a continuation of and claims priority to U.S. patent application Ser. No. 16/619,923 (now patent Ser. No. 11/237,640), entitled "WEARABLE DEVICE ENABLING MULTI-FINGER GESTURES," filed on Dec. 5, 2019, which claims priority to International Application No. PCT/CN2017/087814, filed on Jun. 9, 2017, the disclosures of which are incorporated herein by reference in their entireties.

BACKGROUND

Wearable devices are smart electronic devices (electronic devices with microcontrollers) that can be worn on the bodies as implants or accessories. These wearable devices can perform many of the same computing tasks as mobile phones and laptop computers. A wearable device makes technology pervasive by interweaving it into daily life. Examples of wearable devices include, but are not limited to, watches, glasses, contact lenses, e-textiles and smart fabrics, headbands, beanies and caps, jewelry such as rings, bracelets, and hearing aid-like devices that are designed to look like earrings. Many efforts have been put on expanding input modalities and functions of wearables, with less attention paid to wearability and usability aspects. Furthermore, a wearable device with complicated hardware (e.g., high-cost sensors) and calculation demanding software leads to high power consumption and a cumbersome device form.

SUMMARY

Embodiments of the subject matter described herein provide a wearable device. Generally, the wearable device includes two sensors and a controller. A first sensor is configured to detect one or more movements of a first finger of a user, while a second sensor is configured to detect one or more movements of a second finger that is different from the first finger. The controller is configured to determine a relative movement between the first finger and the second finger based on the movements of the first and second fingers. Such relative movement defines a multi-finger gesture. Then the controller can control a terminal device associated with the wearable device based on the multi-finger gesture.

It is to be understood that the Summary is not intended to identify key or essential features of implementations of the subject matter described herein, nor is it intended to be used to limit the scope of the subject matter described herein. Other features of the subject matter described herein will become easily comprehensible through the description below.

DESCRIPTION OF DRAWINGS

The above and other objectives, features and advantages of the subject matter described herein will become more apparent through more detailed depiction of example embodiments of the subject matter described herein in conjunction with the accompanying drawings, wherein in the example embodiments of the subject matter described herein, same reference numerals usually represent same components.

FIG. 3 shows an example of watchband powering the wearable device according to embodiments of the subject matter described herein;

FIGS. 4a-4h are schematic diagrams illustrating an example multi-finger gesture and associated sensor data;

Throughout the drawings, the same or similar reference symbols are used to indicate the same or similar elements.

DETAILED DESCRIPTION OF EMBODIMENTS

Figure 1:
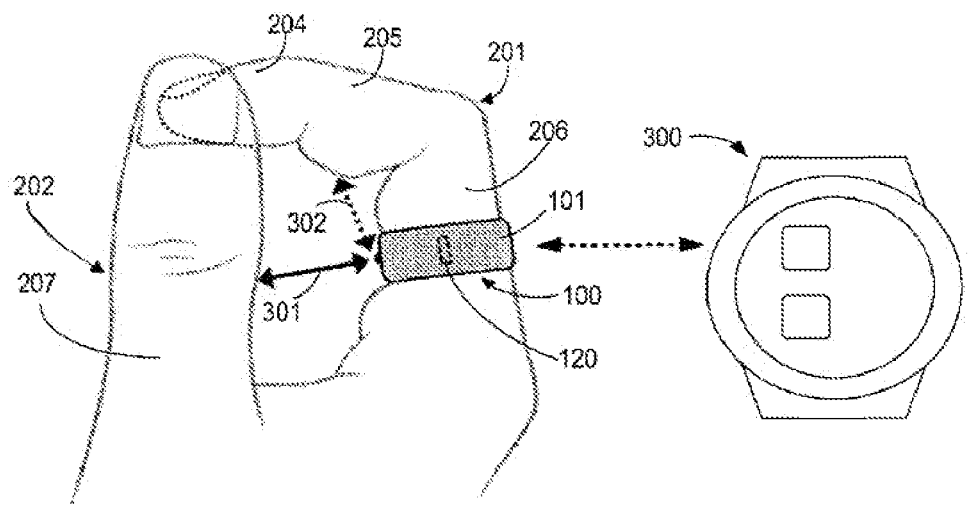
FIG. 1 is a schematic diagram illustrating an example application of the wearable device according to embodiments of the subject matter described herein.

Principles of the subject matter described herein will now be described with reference to several example embodiments shown in the drawings. Though example embodiments of the subject matter described herein are illustrated in the drawings, it is to be understood that the embodiments are described only to facilitate those skilled in the art in better understanding and thereby achieving the subject matter described herein, rather than to limit the scope of the disclosure in any manner.

As used herein, the phrase "include(s)" and its variants shall be interpreted as an open term meaning "including but not limited to." The phrase "based on" shall be interpreted as "at least partially based on." The phrase "an embodiment" or "one embodiment" shall be interpreted as "at least one embodiment." The term "a" shall be interpreted as "one or more" unless otherwise specified. The phrase "another embodiment" shall be interpreted as "at least one other embodiment." The phrases like "first" and "second" may refer to different or the same objects. Other definitions might also be included explicitly and implicitly in the following description.

Some values or value ranges might be described in the following. It is to be understood that these values and value ranges are only for the purpose of illustration, which may be advantageous to practice the idea of the subject matter described herein. However, depiction of these examples is not intended to limit the scope of the subject matter described herein in any manner. According to the specific application scenarios and needs, the values or value ranges may be set otherwise.

Overview

Conventionally, many projects about wearable devices have focus on expanding input modalities and functions. For example, a kind of wearable device uses an inertial measurement unit (IMU) sensor to enable the input of 9 aerial movements and other functions (e.g., context recognition). Although these aerial movements can provide the user with a fantastic experience, the aerial movements without tactile feedback accumulate a large amount of fatigue in a short time, which makes it unsuitable for daily extended usage. Additionally, IMU based devices are often low-sensitivity, which requires exaggerated movements to be recognized.

Furthermore, some current wearable devices use complicated hardware (e.g., high-cost sensors) and calculation demanding software (e.g., machine learning), which leads to high power consumption and a cumbersome device form. For example, a kind of wearable device enables 6 input modalities by using electric field (EF) sensing. However, it includes hardware that constantly generates an EF signal, which consumes battery power rapidly and inevitably increases the battery size and device size.

Embodiments of the subject matter described herein provide a wearable device which can be formed, for example, as a ring as shown in FIG. 1. In this example, the wearable device 100 can be worn on a finger of the user. The wearable device 100, among other things, is equipped with a collection of sensors to detect a relative movement of two or more fingers such as a first finger 201 and a second finger 202. The wearable device 100 recognizes a multi-finger gesture based on such relative movement of different fingers and then controls an associated terminal device 300 based on the multi-finger gesture. In this way, the user may control and interact with the terminal device in a more efficient and flexible way. Detailed description of the example shown in FIG. 1 will be provided in the following paragraphs.

Now some example structures and functionalities of the wearable device 100 will be described.

Example Structure

Figure 2:
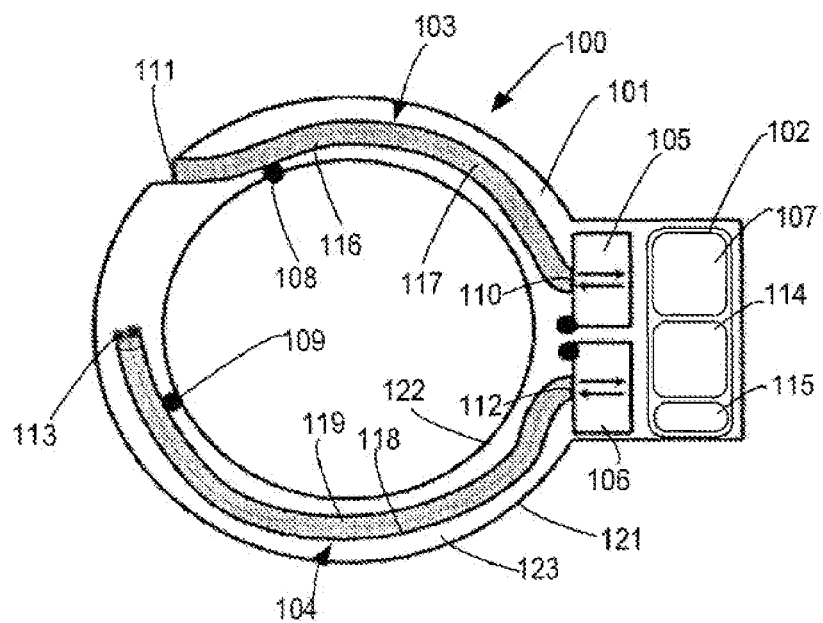
FIG. 2 is a block diagram illustrating an example structure of the wearable device according to embodiments of the subject matter described herein.

FIG. 2 shows an example structure of the wearable device 100 according to embodiments of the subject matter described herein. In this example, the wearable device 100 is generally of a ring shape that can be worn on a user's finger. As shown, the wearable device 100 has a ring-shaped housing 101 including an outer side 121, an inner side 122 and a side portion 123 therebetween. It should be understood that the wearable device 100 can be any kind of shape which is adapted to be worn on the finger. In some embodiments, the wearable devices 100 may be integrated in a ring or a ring-like object.

According to embodiments of the subject matter described herein, the wearable device 100 includes at least two sensors 105, 106, which are referred to as a first sensor 105 and a second sensor 106, respectively. These two sensors 105, 106 are used to detect the movements of at least two different fingers 201, 202 of the user. Examples of the movements of the fingers 201, 202 include, but are not limited to, holding the position, sliding, tapping, moving close to or apart from one another, or the like. Specifically, in the context of the subject matter described herein, keeping still can be considered as a special kind of "movement".

The first sensor 105 and/or the second sensor 106 may be infrared proximity sensors, for example. An infrared proximity sensor has small, lightweight, low power-consumption and low-cost capability which makes the wearable device further lightweight and low power-consumption. It should be understood that other kinds of distance measurement sensors, such as optical sensors, capacitive sensors and ultrasonic sensors, can also be used. In the cases of no need for light transmission, the fibers can be omitted or adjusted to other structure as needed.

The first sensor 105 is configured to detect at least one movement of the first finger 201 or a segment(s) thereof, and the second sensor 106 is configured to detect at least one movement of the second finger 202 or a segment(s) thereof, as shown in FIG. 1, for example. Specifically, in some embodiments, the wearable device 100 may be worn on one of the fingers 201 and 202. In other embodiments, it is also possible that the wearable device 100 is worn on a third finger different from the first and second fingers 201, 202. Moreover, it will be appreciated that the first and second fingers 201, 202 may or may not belong to the same hand of the user.

In some embodiments, either or both of the first and second sensors 105, 106 can detect movements of multiple portions of the respective finger(s). Portions of a finger may include, for example, segments separated by joints, side portion, ventral side, base, tip, and even nail cover of a finger. Compared with some high-intensity movements, such as aerial movements, the finger movements that need to be detected by the first and second sensors 105, 106 are only the relative movements between two different fingers, for example, of one hand. It will be appreciated that such movements are very subtle ones and need small muscle movements without aerial or hand-raising actions. Accordingly, the movements needed to be detected are less fatigue, which enable the user to wear the wearable device 100 for a long period, just like wearing a normal ring. Moreover, only two fingers are required to get involved in the interaction, which is preferable compared with single-hand-operations as the other three fingers of the occupied hand can still perform some tasks, such as holding a bag.

The wearable device 100 also includes a control module 102. The control module 102 may include a controller 107, a battery 115 and a communication module 114, which will be discussed in the following paragraphs. In some embodiments, the first and/or second sensors 105, 106 may be also located in the control module 102. The control module 102 and the housing 101 can be integrally formed. Alternatively, the control module 102 can be attached to the ring-shaped housing 101 by means of clamping, gluing, or the like. The control module 102, as shown in FIG. 2, may be arranged at the top of the ring-shaped housing 101, like a diamond on the top of the diamond-ring. As such, the thickness of the ring-shaped housing 101 can be reduced. For example, in an example implementation, the thickness of the housing 101 may be less than 1 mm, which can be easily worn all day long without any discomfort.

The controller 107 is configured to determine the relative movement between two fingers 201, 202 by receiving and analyzing the movement data of the fingers detected by the first and second sensors 105, 106. Such a relative movement between two fingers 201, 202 defines a two-finger gesture. It will be appreciated that when there are more sensors in the wearable device 100 to detect movements of three or more fingers of the user, the controller 107 may determine a multi-finger gesture accordingly. Since it is only required to detect quite simple and small movements of the fingers, the controller 107 can be implemented as a low power-consumption and low-cost tiny microcontroller such as an 8-bit MCU, for example. In this way, the size of the wearable device 100 can be further reduced.

The controller 107 may control a terminal device 300 associated with the wearable device 100, as shown in FIG. 1, based on the relative movement. Examples of the associated terminal device 300 include, but are not limited to, a phone, a laptop computer, a tablet personal computer, a desktop computer and even other wearable devices such as an HMD, a smartwatch, or the like.

In order to detect movements of the fingers 201, 202, in some embodiments, the wearable device 100 may include a plurality of conductor assemblies, for example, a first conductor assembly 103 and a second conductor assembly 104. The first conductor assembly 103 has a first end 110 and a second end 111. In some embodiments, the first end 110 is coupled to the first sensor 105, and the second end 111 is orientated to the first finger 201. Likewise, the second conductor assembly 104 may have a third end 112 coupled to the second sensor 106 and a fourth end 113 orientating to the second finger 202. In this way, by arranging the orientations of the ends of the conductor assemblies, movements of different fingers can be detected.

In some embodiments, the second end 111 and the fourth end 113 may be located at the bottom of the ring-shaped housing 101, as shown in FIG. 2. In some embodiments, at least one of the second end 111 and the fourth end 113 may be located at the side part (as shown as a dotted rectangle 120 in FIG. 1) or any position between the bottom and the side part of the ring-shaped housing 101.

By way of example, in some embodiments, the first conductor assembly 103 may include a first fiber 116 and a second fiber 117. The first and second fibers 116, 117 can be arranged in a first channel 108 within the housing 101, for example. The first channel 108 may be a hollow structure which can reduce the weight of the wearable device 100.

Specifically, as described above, at the second end 111, the first and second fibers 116, 117 are orientated to the first finger 201 to be detected. In operation, under control of the controller 107, the first fiber 116 may transmit a signal emitted form the first sensor 105 to the first finger 201, while the second fiber 117 is used to transmit an echo signal from the first finger 201 to the first sensor 105. The time different between the echo signal and the emitting signal will vary with the distance between the first finger 201 and the first sensor 105. Then the time different as an input will be transmitted from the first sensor 105 to the controller 107. In those embodiments, the controller 107 may detect the movement of the first finger 201 by analyzing the time difference, for example.

In some embodiments, the strength of the echo signal varies with the distance between the first finger 201 and the first sensor 105. In those embodiments, the echo signal strength will be transmitted from the first sensor 105 to the controller 107, which then detects the movement of the first finger 201 by analyzing the echo signal strength.

Similar to the first conductor assembly 103, the second conductor assembly 104 may include a third fiber 118 and a fourth fiber 119. The third and fourth fibers 118, 119 may be arranged in a second channel 109 within the ring-shaped housing 101. The second conductor assembly 104 may operate in a similar fashion to the first conductor assembly 103, which will not be repeated herein.

As shown in FIG. 2, in some embodiments, the first fiber 116 and the second fiber 117 may be provided in the single first channel 108 formed previously. In some embodiments, the first and second fibers 116, 117 may be arranged in two channels separately. Likewise, the third fiber 118 and the fourth fiber 119 may be arranged in the single second channel 109 formed previously or in two channels separately. In some embodiments, the first channel 108 and the second channel 109 may be formed by three-dimensional (3D) printing. It should be understood that the first and second channels 108,109 may be formed in other ways, such as mold forming or the like.

In some embodiments, the first fiber 116 and the second fiber 117 may be provided in a first groove (not shown) formed in the inner side 122 of the ring-shaped housing 101. Likewise, the third fiber 118 and the fourth fiber 119 may be provided in a second groove (not shown) formed in the inner side 122 of the ring-shaped housing 101. Likewise, in those embodiments, the first groove and the second groove may be formed by 3D printing or in other ways.

In some embodiments, the first conductor assembly 103 and the second conductor assembly 104 are arranged in the ring-shaped housing 101. Alternatively, the first conductor assembly 103 is arranged along a first half of the ring-shaped housing 101 and the second conductor assembly 104 is arranged along the another half. It should be understood that in other embodiments, the first and second conductor assemblies 103, 104 also can arranged side by side along one common half of the ring-shaped housing 101.

In some embodiments, the first and second sensors 105, 106 may be attached to the ring-shaped housing 101 directly without the conductor assemblies 103, 104. For example, in some embodiments, the first and second sensors 105, 106 may be located at the bottom of the ring-shaped housing 101. In some embodiments, at least one of the first and second sensors 105, 106 may be located at the side part or any position between the bottom and the side part of ring-shaped housing 101.

As mentioned above, in some embodiments, the control module 102 may include the communication module 114 for communicating with the associated terminal device 300 of FIG. 1, which can be wired or wireless. For example, a Bluetooth-Low-Energy based module may be used as the communication module 114. In some embodiments, other suitable communicating means, such as those based on Radio Frequency Identification (RFID), Near Field Communication (NFC), Wi-Fi, or the like, may be used as the communication module 114.

Still in reference to FIG. 2, in some embodiments, the control module 102 may include a battery 115. Due to the low power consumption of controller 107, the first and second sensors 105, 106 and the other essential components, the size of the battery 115 can be very small. In some embodiments, the battery 115 may be replaced with a coil antenna module (not shown) used to power the wearable device 100. Thus, the size of the control module 102 can be reduced further. In this case, the coil antenna module can be used to transmit power from the surrounding devices and other wearable devices, such as a watchband 400 or the like, to the wearable device 100, as shown in FIG. 3. Alternatively, both the ring-shaped housing 101 and the watchband 400 have parallel-faced ring-shaped parts that are suitable for embedding coil antennas for power transmission.

Example Design Process

It will be appreciated that sizes and/or shapes of hands of different individuals are different. As a result, an ideal size of the wearable device 100 and the positions of some components, such as the position of the control module 102, may vary for each user. In some embodiments, the wearable device 100 may be achieved by personalized design with the data representing the 3D shape of a finger or a hand. Specifically, the data representing the 3D shape of the finger or the hand may be collected by various conventional methods, such as 3D scanning, which can obtain the shape data of the finger on which the wearable device 100 is to be worn. Based on the 3D shape of the finger or the hand, a design size of the wearable device 100, such as the size of the ring-shaped housing 101 and the position of at least one component on the housing 101, may be determined. Then, based on the size and the position(s), a 3D model can be generated for the wearable device 100 by various conventional methods, such as a lay tracing method.

For example, in some embodiments, the position of the control module 102 relative to the housing 101 of the wearable device 100 may be determined based on the 3D shape of the fingers 201, 202. As mentioned above, in some embodiments, the control module 102 may include at least one of the first sensor 105, the second sensor 106 and the controller 107.

In some embodiments, the first channel 108 and the second channel 109 maybe generated in the 3D model of the wearable device 100, specifically, in the housing 101 of the wearable device 100.

In some embodiments, the ring-shaped housing 101 of the wearable device 100 may be produced or fabricated with via 3D printing based on the 3D model. It should be understood that the wearable device 100 may be produced in other ways, such as injection molding or the like.

Example Multi-Finger Gestures

Now some examples of the multi-finger gesture will be discussed. Only for illustration, these examples will be described with reference to the relative movements of two fingers. The multi-finger gesture may include a single-movement gesture and a multi-movement gesture, which will be discussed further below.

Referring back to FIG. 1, it is assumed the wearable device 100 is worn on the base segment 206 (i.e., the first segment) of the index finger 201 in this example. In this case, the second end 111 of the first conductor assembly 103 is orientated to the side part of the thumb 202 so that the first sensor 105 can detect the first distance 301 from the side part of the thumb 202 to the first sensor 105. The fourth end 113 of the second conductor assembly 103 is orientated to the ventral part of a middle segment 205 of the index finger 201 so that the second sensor 106 can detect the second distance 302 from the ventral part of the middle segment 205 (i.e., the second segment) of the index finger 201 to the second sensor 106. Due to the small size of the ring-shaped housing 101, the first distance 301 is substantially the relevant distance from the side part of the thumb 202 to the base segment 206 of the index finger 201, and the second distance 302 is substantially the relevant distance from the ventral parts of the middle segment 205 to the base segment 206 of the index finger 201. In this way, the set of one or more movements can be detected by the first and second sensors 105, 106.

Single Movement Gestures

In a single-movement gesture mode, in the case of the thumb 202 is not touching the index finger 201 and holding still as shown in FIG. 4a, the distance detected by the first sensor 105 (referred to as distance X 301) and the distance detected by the second sensor 106 (referred to as distance Y 302) remain constant respectively. For example, distance X 301 remains X1, and the distance Y 302 remains Y1. Likewise, in the case of the thumb 202 touching the index finger 201 and holding still as shown in FIG. 4b, the distances detected by the first sensor 105 and the second sensor 106 remain the same respectively. Due to the change of the position of the thumb 202, the distance X 301 remains X2, which may be smaller than X1. In this case, the value of distance X can indicate if the thumb 202 is touching the index finger, which can in turn indicate if a movement starts or ends. It can be seen that the controller 107 may detect a multi-finger gesture by determining a relevant distance of the first and second finger 201, 202. It should be understood that the above is just an example, and the multi-finger gesture may be detected by determining the relevant distance of other fingers.

In some embodiments, the controller 107 may detect a multi-finger gesture by determining a relevant slide between the first and second finger 201, 202 based on the first and second sets of movements. In those embodiments, in response to the different sliding directions, the controller 107 can trigger different actions. For example, in response to detecting that the first finger 201 is sliding along the second finger 202 from left to right, the controller 107 may trigger a respective action in association with the terminal device 300, and in response to detecting that the first finger 201 is sliding along the second finger 202 from right to left, the controller 107 may trigger another respective action in association with the terminal device 300. Now some examples of the sliding movements will be discussed. Only for illustration, these examples will be described below with reference to the relevant slides between the thumb 202 and the index finger 201 based on the first and second sets of movements. It should be understood that the controller 107 can detect other multi-finger gestures by determining the relevant slide between other fingers.

Figure 4C:
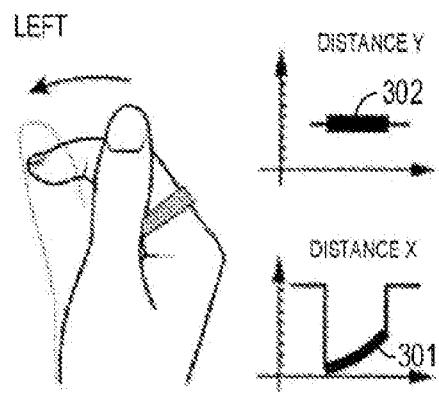
Figure 4D:
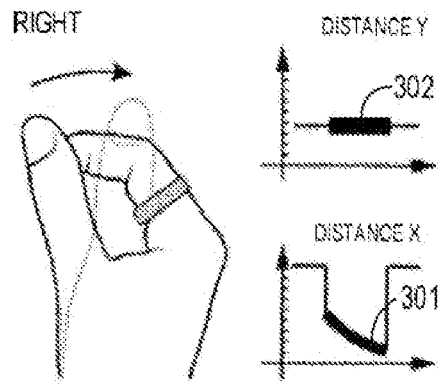

FIGS. 4c-4d show how the distance X 301 and the distance Y 302 change in the case of the thumb 202 sliding along the index finger. In response to the sliding of the ventral side of the thumb 202 along the index finger 201 from left to right, the second sensor 106 can detect the sliding of the thumb 202 and send the detected data to the controller 107, at the same time, the first sensor 105 can detect that the index finger 201 is holding its position and send the detected data to the controller 107, as shown in FIG. 4d.

Based on the above first and second sets of movements, the controller 107 can detect a multi-finger gesture by determining the above relative movements between the index finger 201 and the thumb 202. Then, based on the multi-finger gesture, the controller 107 triggers an action in association with the terminal device 300. For example, the controller 107 may generate a control signal corresponding to a RIGHT operation to control the terminal device 300. Likewise, in response to the sliding of the ventral side of the thumb 202 along the index finger 201 from right to left, as shown in FIG. 4c, based on a multi-finger gesture detected by determining the above relative movements between the index finger 201 and the thumb 202, the controller 107 triggers an action in association with the terminal device 300 by generating a control signal corresponding to a LEFT operation.

Figure 4E:
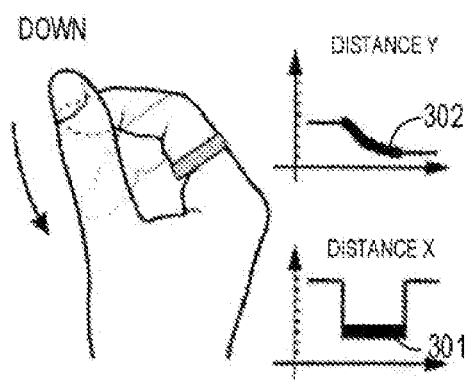
Figure 4F:
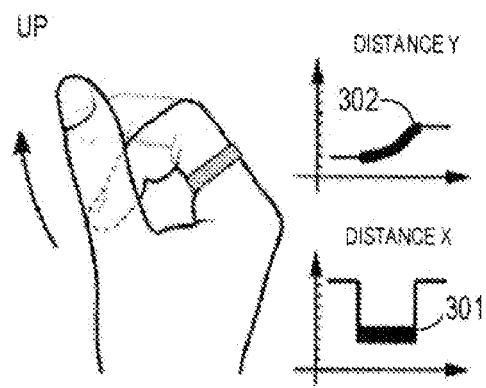

FIGS. 4e-4f show how the distance X 301 and the distance Y 302 change in the case of the index finger 201 sliding along the thumb 202 upwardly and downwardly. Similar to the above, in response to the downward sliding of the side portion of the index finger 201 along the thumb 202, the second sensor 106 can detect that the ventral part of middle segment 205 of the index finger 201 is moving downwardly and send the detected data to the controller 107. At the same time, the first sensor 105 can detect that the thumb 202 is keeping still and send the detected data to the controller 107, as shown in FIG. 4e.

Based on the above first and second sets of movements, the controller 107 can detect a multi-finger gesture by determining the above relative movements between the index finger 201 and the thumb 202. Then based on the multi-finger gesture, the controller 107 triggers an action in association with the terminal device 300 by generating a control signal corresponding to a DOWN operation to control the terminal device 300, as shown in FIG. 4e. Likewise, in response to the upward sliding of the ventral part of middle segment 205 of the index finger 201 along the thumb 202, as shown in FIG. 4f, based on a multi-finger gesture detected by determining the above relative movements between the index finger 201 and the thumb 202, the controller 107 triggers an action in association with the terminal device 300 by generating a control signal corresponding to an UP operation.

It can be seen from the above that in the case of the wearable device 100 being worn on the base segment of the index finger 201, the first sensor 105 can detect at least one movement of the middle segment of the index finger 202. It should be understood that the above is provided for purpose of illustration. In some embodiments, in the case of the wearable device 100 being worn on one segment of another finger, at least one of the first and second sensors 105, 106 can detect another segment of the finger that is different from the segment.

In some embodiments, the controller 107 may detect a tapping gesture by determining a relevant movement between the first and second fingers 201, 202. In this case, in response to the different tapped segments of the finger, the controller 107 can trigger different actions. For example, the controller 107 may trigger a first action in response to detecting that the first finger 201 taps a second segment of the second finger 202 and trigger a second action different from the first action in response to detecting that the first finger 201 taps a third segment of the second finger 202. Now an example of the tapping gesture will be discussed. Only for illustration, these examples will be described below with reference to the tapping gesture of the thumb 202 and the index finger 201. In this case, the middle segment 205 of the index finger 201 is the second segment mentioned above, and the outmost segment 204 of the index finger 201 is the third segment, as shown in FIG. 1. It should be understood that the tapping gesture between other fingers may be detected, and then the controller 107 can trigger respective actions based on the detection likewise.

Figure 4G:
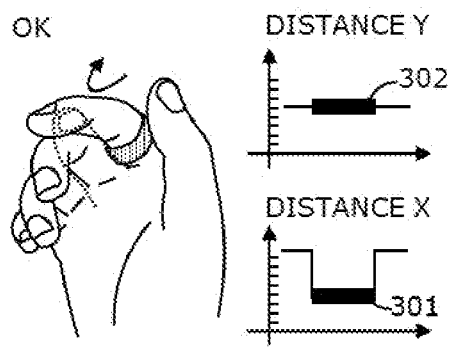

FIG. 4g shows how the distance X 301 and the distance Y 302 change in the case of the thumb 202 tapping an outmost segment 204 (i.e., the third segment) of the index finger or tapping near the outmost segment 204. In this case, the first sensor 105 can detect that the thumb 202 is moving approach to and/or apart from the outmost segment 204 and send the detected data to the controller 107, at the same time, the second sensor 106 can detect that the index finger is keeping still and send the detected data to the controller 107, as shown in FIG. 4e.

Based on the above first and second sets of movements, the controller 107 detects a multi-finger gesture by determining the above relative movements between the index finger 201 and the thumb 202. Then based on the multi-finger gesture, the controller 107 triggers an action in association with the terminal device 300 by generating a control signal corresponding to an OK operation.

Figure 4H:
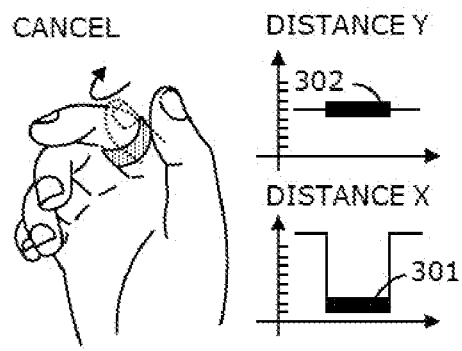

FIG. 4h shows how the distance X 301 and the distance Y 302 change in the case of the thumb 202 tapping a middle segment 205 of the index finger or tapping near the middle segment 205. In this case, the first sensor 105 can detect that the thumb 202 is moving approach to and/or apart from the middle segment 205 and send the detected data to the controller 107. At the same time, the second sensor 106 can detect that the index finger is keeping still and send the detected data to the controller 107, as shown in FIG. 4e.

Based on the above first and second sets of movements, the controller 107 detects a multi-finger gesture by determining the above relative movements between the index finger 201 and the thumb 202. Then based on the multi-finger gesture, the controller 107 triggers another action in association with the terminal device 300 by generating a control signal corresponding to a CANCEL operation. Through the above, it can be seen how simply to achieve the control by means of the wearable devices 100 in accordance with the subject matter described herein. It should be understood that in addition to the actions mentioned above, more actions can be achieved by the subject matter described herein, which will be discussed in the following paragraphs.

Figure 5:
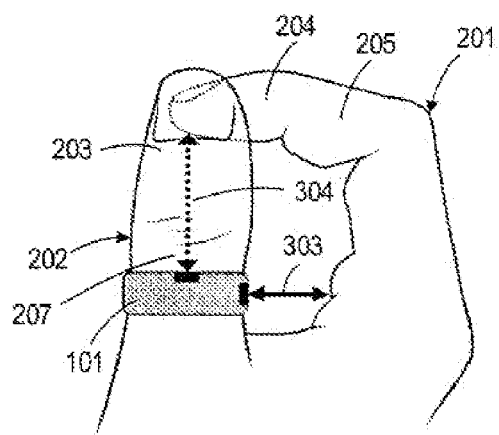
FIG. 5 is a schematic diagram illustrating the wearable device worn on a thumb, according to embodiments of the subject matter described herein.

FIG. 5 shows the case of the wearable device 100 being worn on the thumb 202. Similar to the case of being worn on the index finger 201, the wearable device 100 is worn on the base segment 207 of the thumb 202. In this case, the first sensor 105 may detect the third distance 303 from the ventral part of base segment 206 of the index finger 201 to the first sensor 105, and the second sensor 106 may detect the fourth distance 304 from the ventral part of the outmost segment 204 of the index finger 201 to the second sensor 106. Likewise, the third distance 303 is substantially the relevant distance from the ventral part of base segment 206 of the index finger 201 to the side part of the thumb 202 and the fourth distance 304 is substantially the relevant distance from the ventral part of the outmost segment 204 of the index finger 201 to the base segment 207 of the thumb 202. It should be understood that FIGS. 2 and 5 are merely examples, and the wearable device 100 can be worn on any one segment of any finger, as long as the first and second sensors 105, 106 can detect the set of one or more movements of the same or different fingers.

Similar to the case of the wearable device 100 being worn on the index finger 201, FIGS. 6a-6h show the distance data detected by the first sensor 105 (referred to as distance X 303) and the distance data detected by the second sensor 106 (referred to as distance Y 304) in the case of the wearable device 100 being worn on the thumb 202. In this case, the terminal device 300 may be controlled in a similar fashion to the case of the wearable device 100 being worn on the index finger 201, which will not be repeated herein.

As can be seen from the above that the first sensor 105 and the second sensor 106 can detect one or more subtle relative movements between the index finger 201 and the thumb 202, and the controller 107 can detect a multi-finger gesture by determining the set of one or more movements and control the associated terminal device 300 based on the multi-finger gesture. Compared to the "aerial" or "hand-raising" movements, the above movements use fewer muscles so that it can decrease fatigue in operation.

It can be seen from the above that the movements that can be detected by the first and second sensor 105, 106 are very intuitive and can be easily understood. Further, while performing these movements, natural tactile feedback may be obtained, so that performing these movements can be totally eyes-free. In some embodiments, the wearable device 100 may be combined with audio feedback and provide the user with digital information in scenarios like jogging and walking.

Figure 7A:
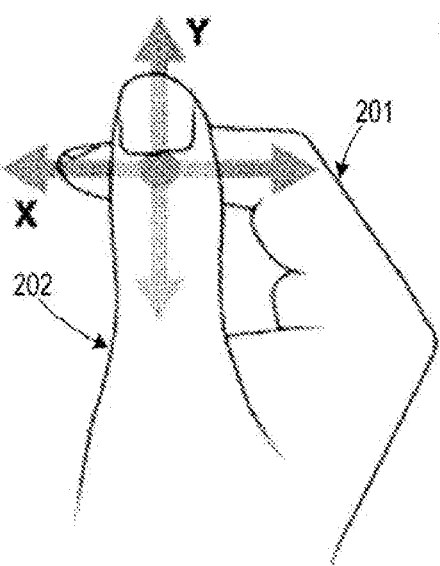
FIG. 7a is a schematic diagram illustrating an example of movement-set can be input by the device with 2-axises movements.
Figure 7B:
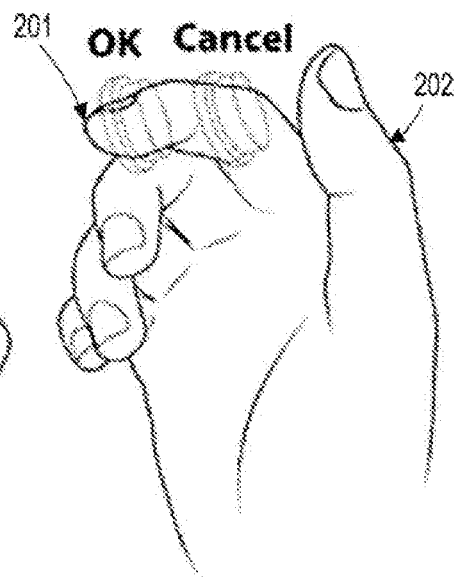
FIG. 7b is a schematic diagram illustrating an example of movement-set can be input by the device with tapping movements.

It will be appreciated that in the single-movement gesture mode, by detecting specific multi-finger gestures, the wearable device 100 can fulfill the X-Y slider (FIG. 7*a*) and two-button functions (FIG. 7*b*). The sets of movements detected by the first and second sensors 105, 106 are similar to those as used in commonly-used handy gamepad devices. Generally, original gamepad device provides 4-way directional cursor operations. The wearable device 100 as described herein is able to provide analog X-Y slider actions, vertical and horizontal scroll wheel operations and X-Y pointing operations, in addition to the conventional 4-way directional cursor operations. Thus, the wearable device 100 may act as a universal input or control device for many kinds of wearable devices and surrounding appliances, such as smartwatches 300, earphones 500, HMDs 600, remote devices 700, or the like.

In some embodiments, finger sliding actions as shown in FIG. 7*a* may be used for different types of operations. For example, in one embodiment, 4-way directional cursor operations can be enabled, where sliding actions of "increasing X", "decreasing X", "increasing Y", and "decreasing Y" may be assigned for "cursor right", "cursor left", "cursor up" and "cursor down", respectively. In one embodiment, 8-way directional cursor operations may be enabled by using the sliding action "increasing X+increasing Y" for "cursor upper-right", for example.

Alternatively, or in addition, in another embodiment, X-Y slider operations may be enabled. For example, by sliding thumb on the side part of index finger, two analog sliders are assigned for both X and Y positions such as sound volume (Y) and balance (X). As such, both volume and balance can be controlled at once. This operation style can also be used as "2D pointing device".

In yet another embodiment, it is possible to implement wheel operations. For example, sliding actions of "increasing X", "decreasing X", "increasing Y" and "decreasing Y" may be interpreted as "horizontal wheel right", "horizontal wheel left", "vertical wheel up" and "vertical wheel down", respectively.

Additionally, unlike the voice input method, the operation of the wearable device 100 is totally silent and private, which makes it available at public spaces and would not bother the user and surrounding people.

Multi-Movement Gestures

Figure 8A:
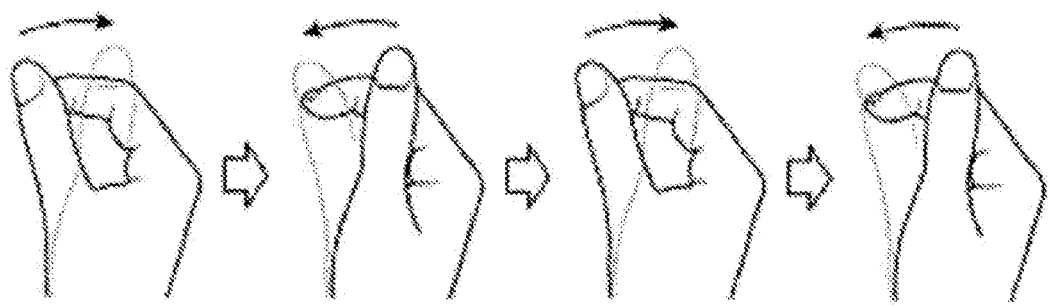
FIG. 8a is a schematic diagram illustrating an example of "Activation/Deactivation" movements.
Figure 8B:
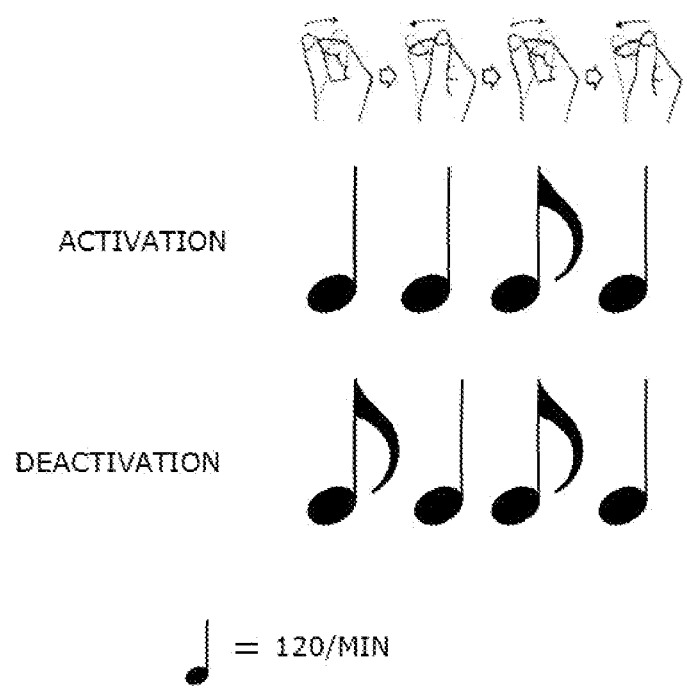
FIG. 8b is a schematic diagram illustrating an example of "Activation/Deactivation" of multi-finger gestures.

As mentioned above, in addition to the single-movement gesture, the multi-finger gesture may include a multi-movement gesture, which is shown in FIGS. 8*a* and 8*b*. In this case, the controller 107 may trigger one or more actions by generating the control signal according to a set of movements, such as rhythmically repeated shuttle-sliding movements of the first finger 201 along the second finger 202, multiple tapping movements of the first finger 201 relative to the second finger 202, or their combinations.

For example, in multi-movement gesture mode, in response to rhythmically repeated shuttle-sliding movements of the first finger 201 along the second finger 202, the controller 107 can detect a multi-finger gesture by determining the above sets of movements. Based on the detected multi-finger gesture, the controller 107 may trigger an action (i.e., the first action) by generating a control signal, for example, corresponding to the ACTIVATION operation which activates a certain function(s) on the associated terminal device. In response to rhythmically repeated shuttle-sliding movements of the second finger 202 along the first finger 201, the controller 107 can detect a multi-finger gesture by determining the above set of movements. Based on the detected multi-finger gesture, the controller 107 may trigger another action (i.e., the second action), for example, corresponding to the DEACTIVATION operation which deactivates a certain function(s) on the associated terminal device.

It should be understood that the ACTIVATION operation or the DEACTIVATION operation are merely examples to illustrate the embodiments. In some embodiments, in response to the above movements of the first and second fingers 201, 202, the controller 107 may trigger one or more other actions by generating one or more control signals, such as opening or closing a specific application when controlling a phone, marking or unmarking a song as a favorite when controlling a MP3, or the like.

In some embodiments, according to the different times or the different frequencies of rhythmically repeated shuttle-sliding and/or tapping movements, the controller 107 can detect different multi-finger gestures by determining the above set of movements. Based on the detected multi-finger gestures, the controller 107 may trigger one or more different actions by generating different control signals.

For example, in response to multiple times (e.g., more than 3 times) of a fast (e.g., more than about 120/min) rhythmically repeated shuttle-sliding movement of the first finger 201 along the second finger 202, the controller 107 can detect a multi-finger gesture by determining the above set of movements. Based on the detected multi-finger gesture, the controller 107 may trigger an action by generating a control signal, for example, corresponding to the operation of selecting and copying the whole words in one paragraph of a document when the wearable device 100 controls a computer. Furthermore, in response to multiple times (e.g., more than 3 times) of a slow (e.g., less than 60/min) rhythmically repeated shuttle-sliding movement of the first finger 201 along the second finger 202, the controller 107 may trigger an action by generating a control signal, for example, corresponding to the operation of selecting and copying whole words in one line.

It can be seen that in the multi-movement gesture mode, the controller 107 can trigger more actions based on various sets of movements, i.e., the wearable devices 100 can control the terminal devices in various ways. In some embodiments, the user may customize the actions triggered by the controller 107 according to a specific set of movements. Thus, the controller 107 may trigger different actions by generating different control signals according to the same set of movements, which depends on the user's customization. In some embodiments, a user also can add customized sets of movements to trigger different actions. For example, the user can customize a set of movements that a combination of rhythmically repeated shuttle-sliding movements and one tapping movement of the first finger 201 along the second finger 202 to trigger an action of deleting a song.

It should be understood that when using such a wearable device 100, it is needed to separate multi-finger gestures or movements from the daily-life movements. Thus, especially in the multi-movement gesture mode, a set of movements that can cause the controller 107 to trigger an action should be a special set of movements that rarely appear in our daily life. For example, by using a set of rarely-appeared movements with rhythm such as fast-fast-slow-fast or slow-fast-slow-fast as shown in FIG. 8b, it is possible to prevent unexpected activation/deactivation. Here "fast" means one time fast sliding movement of the first finger 201 along the second finger 202, while "slow" means one time fast sliding movement. It is to be understood that the special movement-set may be factor pre-set or manually set by the user.

In some embodiments, the user can activate/deactivate the wearable device 100 or switch between the single-movement gesture mode and the multi-movement gesture mode by using a specific set of movements of the first and second fingers 201, 202 to avoid misoperation. For example, in some embodiments, the wearable device 100 may be activated or deactivated by means of a sensor (not shown) or a switch (not shown) placed on the inner side 122 or the outer side 121 of the ring-shaped housing 101 of the wearable device 100. In some embodiments, in response to the wearable device 100 being worn on a user's finger, the wearable device 100 may be activated automatically. In some embodiments, at least a part of the outer side 121 of the ring-shaped housing 101 may be touchable. Thus, in response to touching the specific touchable surface on the outer side 121, the wearable device 100 may be activated or deactivated accordingly.

Furthermore, in deactivated status, either the first sensor 105 or the second sensor 106 is needed to work continuously, while the other sensor may be put on an idle status and is powered when activated. Therefore, the power consumption will be further reduced.

Example Processing Flows

Figure 9:
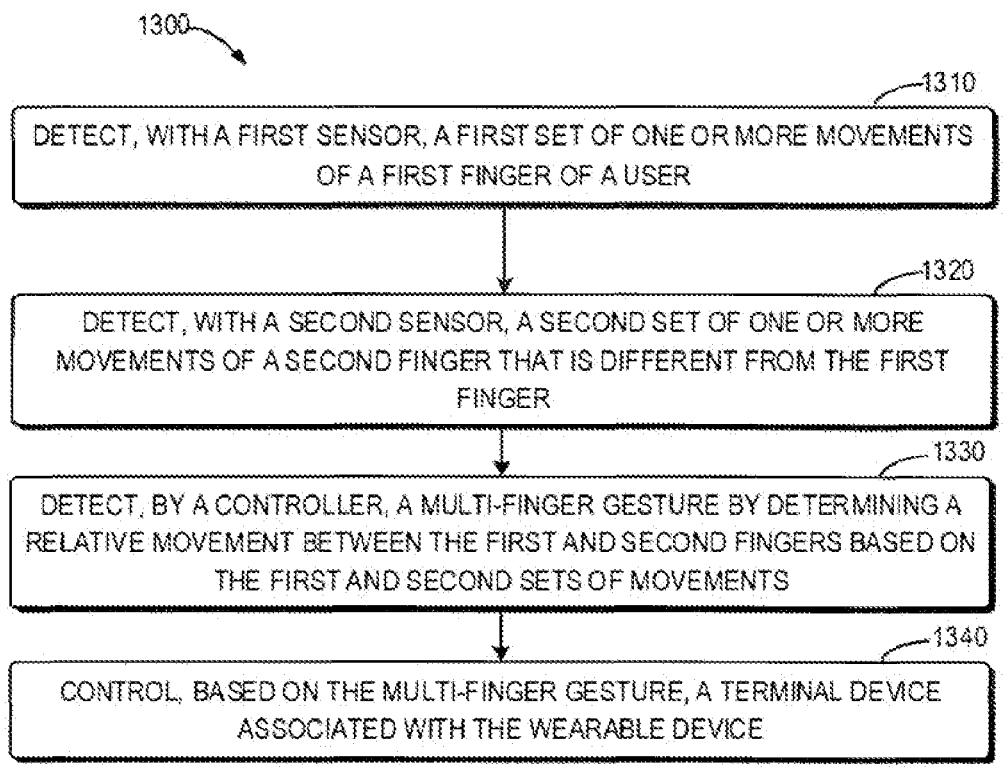
FIG. 9 is a flowchart illustrating a method implemented at the wearable device according to embodiments of the subject matter described herein.

FIG. 9 shows a flowchart of method implement at the wearable device 100 in accordance with one implementation of the subject matter described herein. The method 1300 may be implemented by the controller 107 to control the above mentioned surrounding devices. As shown, in block 1310, a first set of one or more movements of a first finger 201 of a user is detected with a first sensor 105.

In block 1320, a second set of one or more movements of a second finger 202 that is different from the first finger 201 is detected with a second sensor 106. Then in block 1330, a multi-finger gesture is detected by a controller 107 by determining a relative movement between the first and second finger 201, 202 based on the first and second sets of movements. In block 1340, a terminal device 300 associated with the wearable device 100 is controlled based on the multi-finger gesture.

Figure 10:
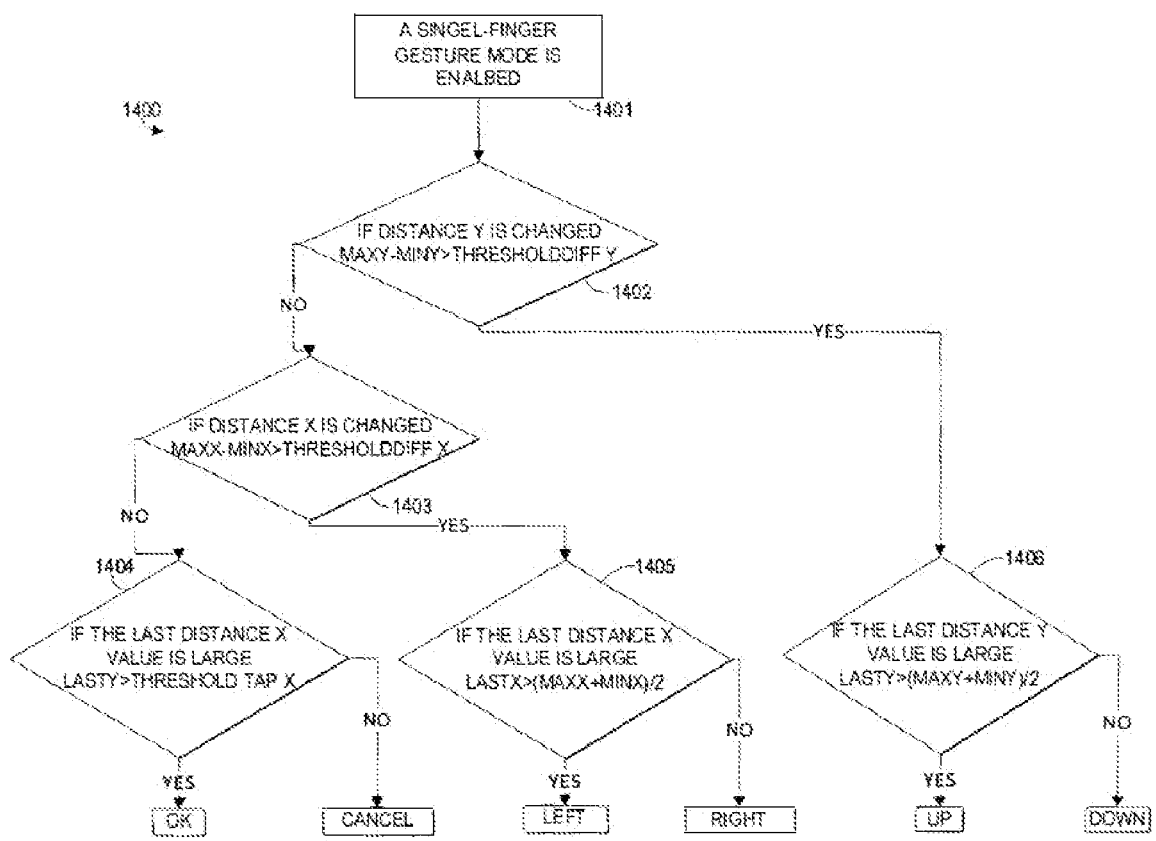
FIG. 10 is a flowchart illustrating a method of movement detection of the wearable device according to embodiments of the subject matter described herein.

Some example implementations of the above process will now be described. Referring now to FIG. 10, which shows an example of recognition-flow of the recognition algorithm 1400 for the controller 107 in a single-movement gesture mode when the wearable device 100 is worn on the index finger 201.

In block 1401, the single-movement gesture mode is enabled, and then in block 1402 the controller 107 determines if the distance Y 302 is changed according to the difference between the maximal distance Y and the minimum distance Y being larger or smaller than a threshold difference Y. The maximal distance Y means the maximal value detected by the second sensor 106 during one recognizing period. One recognizing period may be a pre-set period or may be a period before one control signal is generated. Likewise, the minimum distance Y means the minimum value detected by the second sensor 106 during one recognizing period. Further, the threshold difference Y may be a factor pre-set value which is stored in the controller 107 and cannot be change by the user. In some embodiments, the threshold difference Y may be a value which can be set by the user through other wearable devices or surrounding devices, such as a phone, a computer or the smartwatch 300. By setting the threshold, the misoperation can be effectively avoided.

Likewise, the maximal distance X means the maximal value detected by the first sensor 105 during one recognizing period, and the minimum distance X means the minimum value detected by the first sensor 105 during one recognizing period and the threshold difference X may be a factor pre-set value or a value which can be set by the user.

Figure 6A:
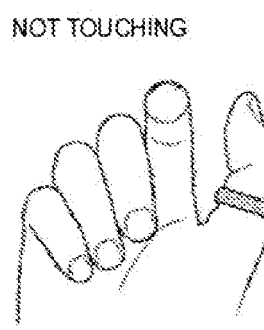
FIGS. 6a-6h are schematic diagrams illustrating another example multi-finger gesture and associated sensor data.
Figure 6A:
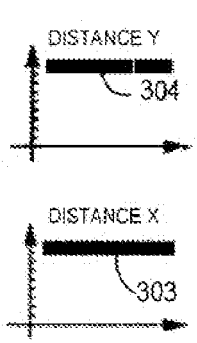
Figure 6B:
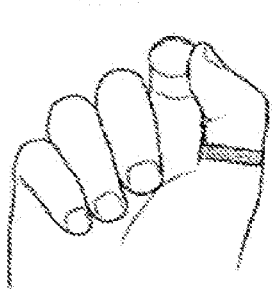
Figure 6C:
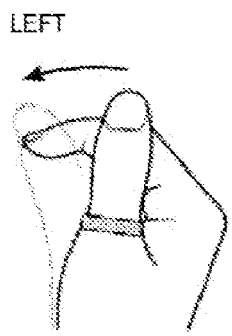
Figure 6D:
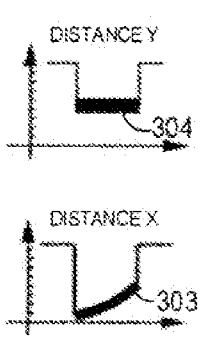
Figure 6E:
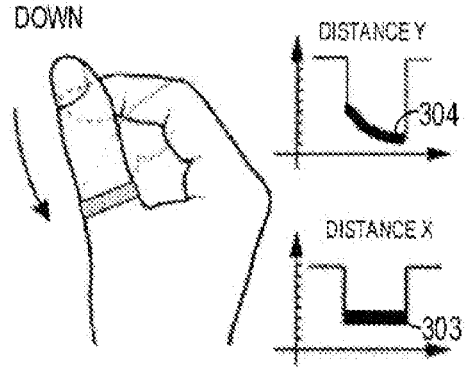
Figure 6F:
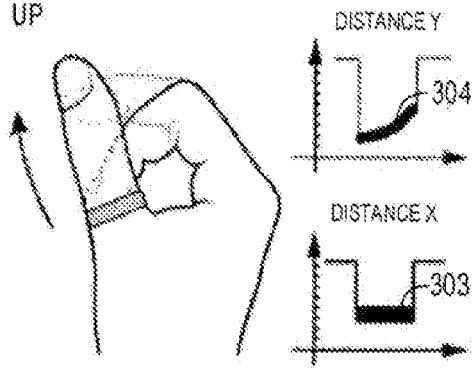

Still in reference to FIG. 10, in block 1406, in the case of the distance Y 302 being changed, i.e., the difference between the maximal distance Y and the minimum distance Y is larger than a threshold difference Y, the controller 107 then detects a multi-finger gesture by determining if the last distance Y (means the final detecting value during one recognizing period) is large by determining if the last distance Y is larger than the average of the maximal distance Y and the minimum distance Y. If the last distance Y is larger than the average, i.e., the last distance Y is large, the controller 107 can detect the multi-finger gesture corresponding to the set of the movements that the ventral part of middle segment 205 of the index finger 201 is moving upwardly. Then the controller 107 triggers an action by generating a control signal corresponding to the UP operation, as shown in FIGS. 4f and 6f. On the contrary, if the last distance Y is smaller than the average, i.e., the last distance Y is small. In this way, the controller 107 can detect a multi-finger gesture corresponding to the set of the movements that the ventral part of middle segment 205 of the index finger 201 is moving downwardly. The controller 107 triggers an action by generating a control signal corresponding to the DOWN operation, as shown in FIGS. 4e and 6e.

In the case of the distance Y 302 being not changed, i.e., the difference between the maximal distance Y and the minimum distance Y is substantially equal to a threshold difference Y, in block 1403, the controller 107 determines if the distance X 301 is changed by determining if the difference between the maximal distance X and the minimum distance X is larger than a threshold difference X. If so, in block 1405, the controller 107 then detects a multi-finger gesture by determining if the last distance X is large by judging if the last distance X is larger than the average of the maximal distance X and the minimum distance X.

If the last distance X is larger than the average, i.e., the last distance X is large, the controller 107 can detect a multi-finger gesture corresponding to the set of the movements that ventral side of the thumb 202 is sliding along the index finger 201 from right to left. Then the controller 107 triggers an action by generating a control signal corresponding to the LEFT operation, as shown in FIGS. 4c and 6c. If the last distance X is smaller than the average, i.e., the last distance Y is small, the controller 107 can detect a multi-finger gesture corresponding to the set of the movements that ventral side of the thumb 202 is sliding along the index finger 201 from left to right. Then the controller 107 triggers an action by generating a control signal corresponding to the RIGHT operation, as shown in FIGS. 4d and 6d.

Figure 6G:
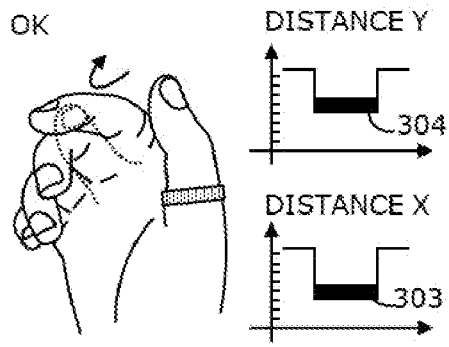
Figure 6H:
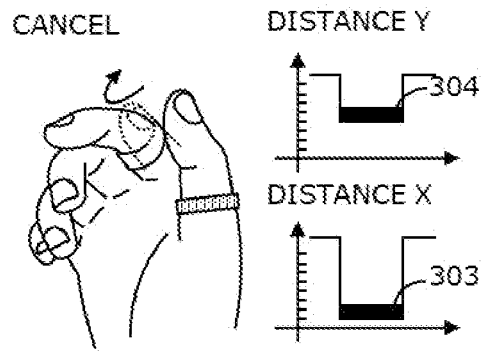

On the other hand, in block 1404, if the distance X 301 is not changed, the controller 107 then determines if the last distance X is changed by determining if the last distance X is larger than the threshold tapping distance X that is used to decide which segment is being taped and can be a factor pre-set or set by the user. If so, the controller 107 detects a multi-finger gesture by determining that the thumb 202 is tapping the outmost segment 204 of the index finger 201, and then triggers an action by generating a control signal corresponding to the OK operation, as shown in FIGS. 4g and 6g. If the last distance X 301 is not larger than the threshold tapping distance X 301, the controller 107 detects a multi-finger gesture by determining that the thumb 202 is tapping the middle segment of the index finger 201, and then triggers an action by generating a control signal corresponding to the CANCEL operation, as shown in FIGS. 4h and 6h.

In the case of the wearable device 100 being worn on the thumb 202, the control process is basically similar to the above, which will not be repeated herein.

Likewise, the recognition algorithm of the multi-movement gesture is simple. As mentioned above, the special set of movements for the multi-movement gesture can be preset or manually set by the user. Then the recognition algorithm can cause the controller 107 to trigger an action by generating a specific control signal by detecting if a set of movements performed by the user is substantially consistent to the special set of movements. The degree of the consistency can be achieved by setting a threshold. For example, the threshold can be set to 90%, which means that if more than 90% of the detected set of movements is consistent to the special set of movements, then the controller 107 is caused to trigger an action by generating the specific control signal corresponding to the special set of movements.

In some embodiments, by using the simplicity of the recognition algorithm, and with for example a Bluetooth-Low-Energy based module being used as the communication module 114, the low power consumption of the wearable device 100 can be achieved.

Furthermore, as mentioned above, for the sake of control, some distance values, such as the minimum distance X, the minimum distance Y, the maximum distance X, the maximum distance Y, the last distance X and the last distance Y, are needed to be detected and recorded. In some embodiments, the controller 107 can adjust the threshold values automatically, such as the threshold distance X, the threshold distance Y and the threshold tapping distance X, according to the above recorded distance values, to make the control more accurately. In some embodiments, the threshold values may be manually set before starting using the wearable device 100. In some embodiments, the threshold values may be pre-set values which may be suitable for most people.

Example Scenarios

As mentioned above, the wearable device 100 can be used with smartwatches, HMDs, headphones and remote devices. The examples of wearable device 100 used in above devices are illustrated below.

Smartwatch Control

Figure 11A:
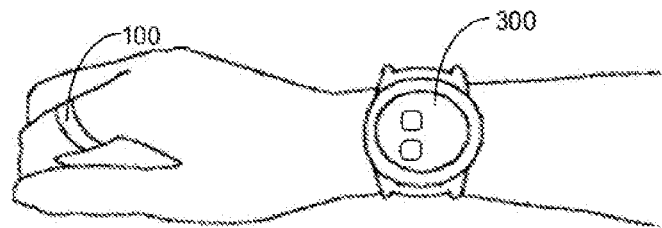
FIG. 11a is a schematic diagram illustrating an example of the wearable device controlling a smartwatch according to embodiments of the subject matter described herein.

As shown in FIG. 11a, the wearable device 100 is used with a smartwatch, which can realize controls, such as 4-direction cursor movements (menu navigation), 1-D slider dragging (volume control) and 2-D surface manipulation (map navigation). Compared to the conventional touch input method, the wearable device 100 can leave the watch screen totally open when operating. It uses only two fingers and the movements, which are totally silent and private. The mapping between movement direction and control direction can be assigned automatically according to hand status, which is very intuitive. In one embodiment, the smartwatch and wearable device may have coil-antennas for power transmission.

Earphone Control

Figure 11B:
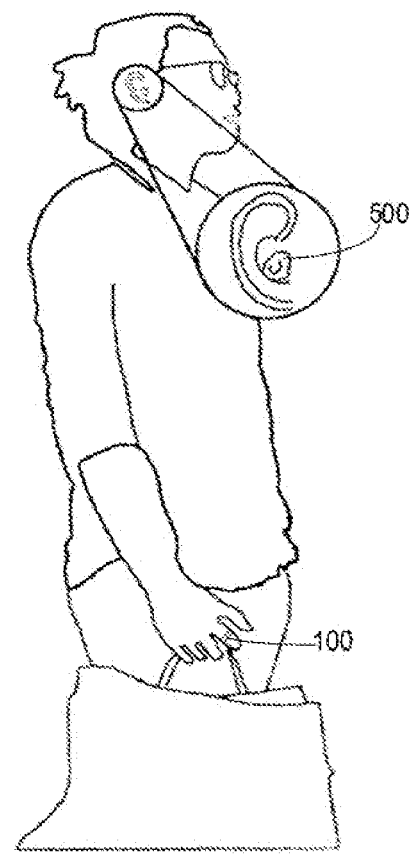
FIG. 11b is a schematic diagram illustrating an example of the wearable device controlling an earphone according to embodiments of the subject matter described herein.

As shown in FIG. 11b, the wearable device 100 is used with an earphone. The conventional input method for earphones is to use the physical controller on the wire or the headphone. However, such operations require users to raise their hand, which are not available when the hands are occupied (e.g. holding bags). The number and size limitation of the control elements also weaken the intuitiveness (e.g., using double-click for the next song and triple-click for the last song). With the wearable device 100, by using subtle multi-finger gestures, all operations can be done easily and intuitively without raising the hand. For example, the set of movements that the first finger 201 slides from left to right twice along the second finger 202 can be used for switching the songs or adjusting the volume. For example, the set of movements that the first finger 201 tapes twice can play or pause the song and tag the song as "liked".

HMD Control

Figure 11C:
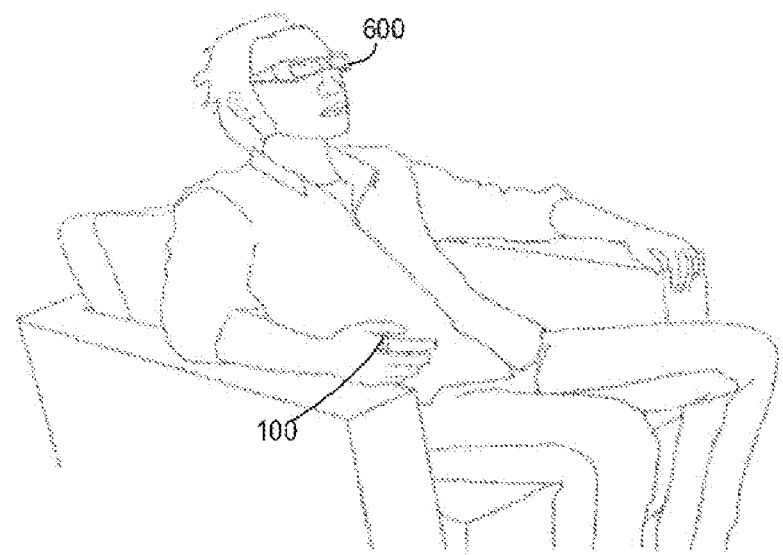
FIG. 11c is a schematic diagram illustrating an example of the wearable device controlling a Head Mount Display (HMD) according to embodiments of the subject matter described herein.

As shown in FIG. 11c, the wearable device 100 is used with an HMD. Existing methods for HMD control are to use voice, aerial gestures or wired controllers. As mentioned above, voice control will inevitably involve privacy issues and aerial gestures can cause significant fatigue. In contrast, the wearable device 100 does not require the user to raise their hands or grab something in hand. It is also private enough that can be done inside the pocket.

Television Control

Figure 11D:
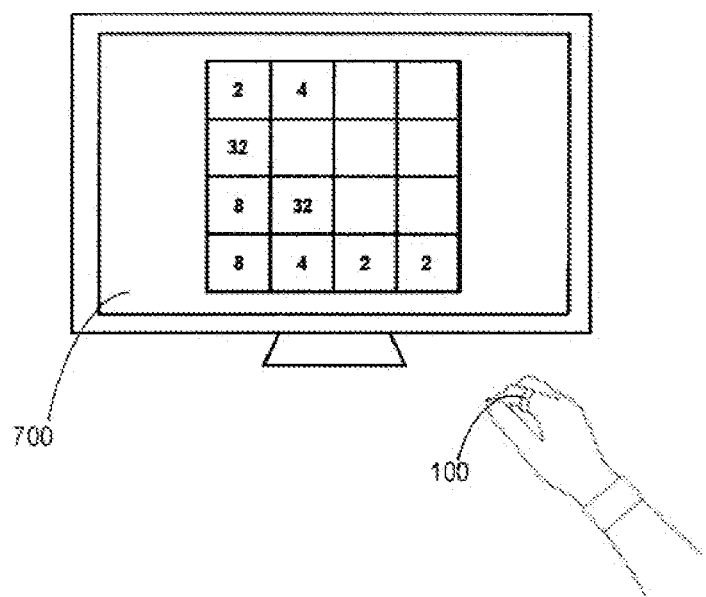
FIG. 11d is a schematic diagram illustrating an example of the wearable device controlling a television according to embodiments of the subject matter described herein.

The wearable device 100 can also be used to control other remote surrounding devices, for example a television, as shown in FIG. 11d. Once connected, navigating the menu or playing simple games can be done easily with the set of one or more movements. This could be helpful for users who may want to avoid direct contacts with public terminal devices (e.g. in the middle of a surgery). In such cases, the wearable device 100 can provide remote control as the result of its universal control benefit.

Example Implementations

Hereinafter, some example implementations of the subject matter described herein will be enumerate.

In some embodiments, a wearable device is provided. The wearable device 100, comprises a first sensor 105 configured to detect a first set of one or more movements of a first finger 201 of a user; a second sensor 106 configured to detect a second set of one or more movements of a second finger 202 that is different from the first finger; and a controller 107 configured to detect a multi-finger gesture by determining a relative movement between the first and second fingers 201, 202 based on the first and second sets of movements; and control, based on the multi-finger gesture, a terminal device 300 associated with the wearable device.

In some embodiments, the wearable device further comprises a first conductor assembly 103 including a first end 110 coupled to the first sensor 105 and a second end 111 extending from the wearable device 100 and orientating to the first finger 201; and a second conductor assembly 104 including a third end 112 coupled to the second sensor 106 and a fourth end 113 extending from the wearable device 100 and orientating to the second finger 202.

In some embodiments, the first conductor assembly 103 includes a first fiber 116 operable to transmit a signal emitted by the first sensor 105 to the first finger 201, and a second fiber 117 operable to transmit an echo signal from the first finger 201 to the first sensor 105, and the second conductor assembly 104 includes a third fiber 118 operable to transmit a signal emitted by the second sensor 106 to the second finger 202, and a fourth fiber 119 operable to transmit an echo signal from the second finger 202 to the second sensor 106.

In some embodiments, the first conductor assembly 103 is arranged in a first channel 108, and the second conductor assembly 104 is arranged in a second channel 109, the first and second channels being formed in a housing 101 of the wearable device 100.

In some embodiments, at least one of the first and second sensors 105, 106 is an infrared proximity sensor.

In some embodiments, the wearable device 100 is worn on a first segment 206 of the first finger 201, and the first sensor 105 is configured to detect at least one movement of at least one second segment 204 of the first finger 201 that is different from the first segment 206.

In some embodiments, the controller 107 is configured to detect the multi-finger gesture by determining a relevant distance of the first and second fingers 201, 202.

In some embodiments, the wearable device 100 further comprises a battery module 115 or a coil-antenna module configured to power the wearable device.

In some embodiments, the controller 107 is configured to the multi-finger gesture by determining a relevant slide between the first and second fingers based on the first and second sets of movements.

In some embodiments, the controller 107 is configured to: in response to detecting that the first finger 201 taps a second segment of the second finger 202, trigger a first action in association with the terminal device 300; and in response to detecting that the first finger 201 taps a third segment of the second finger 202, trigger a second action in association with the terminal device 300.

In some embodiments, the wearable device 100 is of a ring shape.

In some embodiments, a method for designing a wearable device 100 is provided. The method comprises: collecting data representing a three-dimensional (3D) shape of a finger 201, 202 of a user; determining a size of the wearable device 100 based on the 3D shape of the finger; determining a position of at least one component of the wearable device 100 based on the 3D shape of the finger; and generating a 3D model for the wearable device 100 based on the size of the wearable device 100 and a position of the at least one component.

In some embodiments, determining a position of at least one component of the wearable device comprises determining a position of a control module 102 relative to a housing 101 of the wearable device 100, the controlling module 102 including at least one of a first sensor 105, a second 106 and a controller 107.

In some embodiments, generating a 3D model comprises generating, in the 3D model of the wearable device 100, a first channel 108 and a second channel 109 in a housing 101 of the wearable device 100, the first channel being used to arrange a first conductor assembly 103, and the second channel being used to arrange a second conductor assembly 104.

In some embodiments, collecting the data comprises collecting the data representing 3D shape of the finger 201, 202 by 3D scanning.

In some embodiments, a method implemented at a wearable device 100 is provided. The method comprises detecting a first set of one or more movements of a first finger 201 of a user with a first sensor 105; detecting a second set of one or more movements of a second finger 202 that is different from the first finger with a second sensor 106; detecting a multi-finger gesture by determining a relative movement between the first and second fingers 201, 202 based on the first and second sets of movements by a controller 107; and controlling a terminal device 300 associated with the wearable device 100 based on the multi-finger gesture.

In some embodiments, the method further comprises detecting at least one movement of at least one second segment 204 of the first finger 201 that is different from the first segment 206 of the first finger 201 on which the wearable device 100 is worn with first sensor 105.

In some embodiments, detecting the multi-finger gesture comprises detecting at least one movement of at least one second segment 204 of the first finger 201 that is different from the first segment 206 of the first finger 201 on which the wearable device 100 is worn.

In some embodiments, detecting the multi-finger gesture comprises detecting the multi-finger gesture by determining a relevant slide between the first and second fingers 201, 202 based on the first and second sets of movements.

In some embodiments, controlling the terminal device 300 comprises triggering a first action in association with the terminal device 300 in response to detecting that the first finger 201 taps a second segment of the second finger 202, and triggering a second action in association with the terminal device 300 in response to detecting that the first finger 201 taps a third segment of the second finger 202.

It should be appreciated that the above detailed embodiments of the present disclosure are only to exemplify or explain principles of the present disclosure and not to limit the present disclosure. Therefore, any modifications, equivalent alternatives and improvement, etc. without departing from the spirit and scope of the present disclosure shall be included in the scope of protection of the present disclosure. Meanwhile, appended claims of the present disclosure aim to cover all the variations and modifications falling under the scope and boundary of the claims or equivalents of the scope and boundary.

The invention claimed is:

1. A computerized method implemented at a wearable device, the computerized method comprising:
    detecting, by a sensor, a movement of a segment of a finger relative to the sensor;
    detecting, by the sensor, a maximum value and a minimum value of a distance from the segment of the finger to the sensor between a beginning and an end of the movement;
    determining, by a controller, that a difference between the maximum value and the minimum value of the distance is above a threshold value;
    determining, by the controller, that a value of the distance, detected by the sensor at the end of the movement, is greater than an average of the maximum value and the minimum value;
    based on the determination that the value of the distance at the end of the movement is greater than the average, identifying, by the controller, that the segment of the finger was moving away from the sensor; and
    based at least on the identification that the segment of the finger was moving away from the sensor, controlling an activation or a deactivation of a function of a terminal device associated with the wearable device.

2. The computerized method of claim 1, wherein the maximum value and the minimum value of the distance is detected during a pre-set period or before a control signal is generated.

3. The computerized method of claim 1, wherein the threshold value is stored in the controller and cannot be changed by a user.

4. The computerized method of claim 1, wherein the threshold value is set by a user through another device different from the wearable device.

5. The computerized method of claim 1, further comprising:
- determining, by the controller, that the value of the distance, detected by the sensor at the end of the movement, is less than or equal to the average of the maximum value and the minimum value;
- based on the determination that the value of the distance at the end of the movement is less than or equal to the average, identifying, by the controller, that the segment of the finger was toward the sensor; and
- based at least on the identification that the segment of the finger was moving toward the sensor, generating a control signal corresponding to a down operation to control the terminal device associated with the wearable device.

6. The computerized method of claim 1, wherein the terminal device includes a phone, a laptop computer, a tablet personal computer, a desktop computer, a head mounted device (HMD), or a smartwatch.

7. The computerized method of claim 1, wherein controlling the activation or the deactivation of the function of the terminal device comprises opening or closing a specific application on the terminal device.

8. A wearable device, comprising:
- a sensor configured to:
  - detecting a movement of a segment of a finger relative to the sensor; and
  - detect a maximum value and a minimum value of a distance from the segment of the finger to the sensor between a beginning and an end of the movement; and
- a controller configured to:
  - determine that a difference between the maximum value and the minimum value of the distance is above a threshold value;
  - determine that a value of the distance, detected by the sensor at the end of the movement, is greater than an average of the maximum value and the minimum value;
  - based on the determination that the value of the distance at the end of the movement is greater than the average, identify that the segment of the finger was moving away from the sensor; and
  - based at least on the identification that the segment of the finger was moving away from the sensor, control an activation or a deactivation of a function of a terminal device associated with the wearable device.

9. The wearable device of claim 8, wherein the maximum value and the minimum value of the distance is detected during a pre-set period or before a control signal is generated.

10. The wearable device of claim 8, wherein the threshold value is stored in the controller and cannot be changed by a user.

11. The wearable device of claim 8, wherein the threshold value is set by a user through another device different from the wearable device.

12. The wearable device of claim 8, wherein the controller is further configured to:
- determine that the value of the distance, detected by the sensor at the end of the movement, is less than or equal to the average of the maximum value and the minimum value;
- based on the determination that the value of the distance at the end of the movement is less than or equal to the average, identify that the segment of the finger was moving toward the sensor; and
- based at least on the identification that the segment of the finger was moving toward the sensor, generate a control signal corresponding to a down operation to control the terminal device associated with the wearable device.

13. The wearable device of claim 8, wherein the terminal device includes a phone, a laptop computer, a tablet personal computer, a desktop computer, a head mounted device (HMD), or a smartwatch.

14. The wearable device of claim 8, wherein controlling the activation or the deactivation of the function of the terminal device comprises opening or closing a specific application on the terminal device.

15. A system comprising:
- a wearable device;
- a processor, and
- a memory storing instructions that when executed by the processor perform operations comprising:
  - detecting, by a sensor, a movement of a segment of a finger relative to the sensor;
  - detecting, by the sensor, a maximum value and a minimum value of a distance from the segment of the finger to the sensor between a beginning and an end of the movement;
  - determining that a difference between the maximum value and the minimum value of the distance is above a threshold value;
  - determining that a value of the distance, detected by the sensor at the end of the movement, is greater than an average of the maximum value and the minimum value;
  - based on the determination that the value of the distance at the end of the movement is greater than the average, identifying that the segment of the finger was moving away from the sensor; and
  - based at least on the identification that the segment of the finger was moving away from the sensor, controlling an activation or a deactivation of a function of a terminal device associated with the wearable device.

16. The system of claim 15, wherein the maximum value and the minimum value of the distance is detected during a pre-set period or before a control signal is generated.

17. The system of claim 15, wherein the threshold value is set by a user through another device different from the wearable device.

18. The system of claim 15, wherein the memory stores further instructions that when executed by the processor perform operations comprising:
- determining that the value of the distance, detected by the sensor at the end of the movement, is less than or equal to the average of the maximum value and the minimum value;
- based on the determination that the value of the distance at the end of the movement is less than or equal to the average, identifying that the segment of the finger was moving toward the sensor; and
- based at least on the identification that the segment of the finger was moving toward the sensor, generating a control signal corresponding to a down operation to control the terminal device associated with the wearable device.

19. The system of claim 15, wherein the terminal device includes a phone, a laptop computer, a tablet personal computer, a desktop computer, a head mounted device (HMD), or a smartwatch.

20. The system of claim 15, wherein controlling the activation or the deactivation of the function of the terminal device comprises opening or closing a specific application on the terminal device.

* * * * *